(12) United States Patent
McShane et al.

(10) Patent No.: US 10,073,645 B2
(45) Date of Patent: Sep. 11, 2018

(54) INITIATING REBUILD ACTIONS FROM DS PROCESSING UNIT ERRORS

(71) Applicant: International Business Machines Corporation, Armonk, NY (US)

(72) Inventors: Niall J. McShane, Arlington Heights, IL (US); Jason K. Resch, Chicago, IL (US); Ilya Volvovski, Chicago, IL (US)

(73) Assignee: International Business Machines Corporation, Armonk, NY (US)

( * ) Notice: Subject to any disclaimer, the term of this patent is extended or adjusted under 35 U.S.C. 154(b) by 94 days.

(21) Appl. No.: 15/363,622

(22) Filed: Nov. 29, 2016

(65) Prior Publication Data

US 2017/0153943 A1 Jun. 1, 2017

Related U.S. Application Data

(60) Provisional application No. 62/260,743, filed on Nov. 30, 2015.

(51) Int. Cl.
*G06F 3/06* (2006.01)
*G06F 11/10* (2006.01)
(Continued)

(52) U.S. Cl.
CPC ............ *G06F 3/0635* (2013.01); *G06F 3/064* (2013.01); *G06F 3/067* (2013.01); *G06F 3/0611* (2013.01);
(Continued)

(58) Field of Classification Search
CPC .... G06F 3/0635; G06F 3/0611; G06F 3/0617; G06F 3/0619; G06F 3/064; G06F 3/0659;
(Continued)

(56) References Cited

U.S. PATENT DOCUMENTS 4,092,732 A 5/1978 Ouchi
5,454,101 A 9/1995 Mackay et al.
(Continued)

OTHER PUBLICATIONS

Shamir; How to Share a Secret; Communications of the ACM; vol. 22, No. 11; Nov. 1979; pp. 612-613.
(Continued)

*Primary Examiner* — John J Tabone, Jr.
(74) *Attorney, Agent, or Firm* — Garlick & Markison; Timothy W. Markison; Patricia A. Markison

(57) ABSTRACT

A method begins by detecting a recovery error when decoding a seemingly valid threshold number of existing encoded data slice. The method continues by sending a notice of the recovery error and a known integrity check value for the data segment to a rebuild module. The method continues by the rebuild module retrieving the set of existing encoded data slices and selectively decoding a different combination of a decode threshold number of existing encoded data slices of the set of existing encoded data slices until the data segment is successfully recovered. The method continues by dispersed storage error encoding the successfully recovered data segment to produce a set of new encoded data slices. The method continues by comparing the seemingly valid encoded data slices with corresponding new encoded data slices on an encoded data slice by encoded data slice basis to identify a corrupted encoded data slice.

14 Claims, 9 Drawing Sheets

(51) Int. Cl.
*G06F 11/07* (2006.01)
*G06F 17/30* (2006.01)
*H04L 29/08* (2006.01)
*H03M 13/15* (2006.01)
*H03M 13/00* (2006.01)
*H04L 12/18* (2006.01)

(52) U.S. Cl.
CPC .......... *G06F 3/0617* (2013.01); *G06F 3/0619* (2013.01); *G06F 3/0659* (2013.01); *G06F 11/0727* (2013.01); *G06F 11/1076* (2013.01); *G06F 11/1092* (2013.01); *G06F 17/30569* (2013.01); *H03M 13/1515* (2013.01); *H03M 13/616* (2013.01); *H04L 12/18* (2013.01); *H04L 67/1008* (2013.01); *H04L 67/1097* (2013.01); *H04L 67/2823* (2013.01)

(58) Field of Classification Search
CPC .. G06F 3/067; G06F 11/0727; G06F 11/1076; G06F 11/1092; G06F 17/30569; H03M 13/1515; H03M 13/616; H04L 12/18; H04L 67/1008; H04L 67/1097; H04L 67/2823
USPC ................................. 714/764, 763, 770, 773
See application file for complete search history.

(56) References Cited

U.S. PATENT DOCUMENTS

| | | |
|---|---|---|
| 5,485,474 A | 1/1996 | Rabin |
| 5,774,643 A | 6/1998 | Lubbers et al. |
| 5,802,364 A | 9/1998 | Senator et al. |
| 5,809,285 A | 9/1998 | Hilland |
| 5,890,156 A | 3/1999 | Rekieta et al. |
| 5,987,622 A | 11/1999 | Lo Verso et al. |
| 5,991,414 A | 11/1999 | Garay et al. |
| 6,012,159 A | 1/2000 | Fischer et al. |
| 6,058,454 A | 5/2000 | Gerlach et al. |
| 6,128,277 A | 10/2000 | Bruck et al. |
| 6,175,571 B1 | 1/2001 | Haddock et al. |
| 6,192,472 B1 | 2/2001 | Garay et al. |
| 6,256,688 B1 | 7/2001 | Suetaka et al. |
| 6,272,658 B1 | 8/2001 | Steele et al. |
| 6,301,604 B1 | 10/2001 | Nojima |
| 6,356,949 B1 | 3/2002 | Katsandres et al. |
| 6,366,995 B1 | 4/2002 | Vilkov et al. |
| 6,374,336 B1 | 4/2002 | Peters et al. |
| 6,415,373 B1 | 7/2002 | Peters et al. |
| 6,418,539 B1 | 7/2002 | Walker |
| 6,449,688 B1 | 9/2002 | Peters et al. |
| 6,567,948 B2 | 5/2003 | Steele et al. |
| 6,571,282 B1 | 5/2003 | Bowman-Amuah |
| 6,609,223 B1 | 8/2003 | Wolfgang |
| 6,718,361 B1 | 4/2004 | Basani et al. |
| 6,760,808 B2 | 7/2004 | Peters et al. |
| 6,785,768 B2 | 8/2004 | Peters et al. |
| 6,785,783 B2 | 8/2004 | Buckland |
| 6,826,711 B2 | 11/2004 | Moulton et al. |
| 6,879,596 B1 | 4/2005 | Dooply |
| 7,003,688 B1 | 2/2006 | Pittelkow et al. |
| 7,024,451 B2 | 4/2006 | Jorgenson |
| 7,024,609 B2 | 4/2006 | Wolfgang et al. |
| 7,080,101 B1 | 7/2006 | Watson et al. |
| 7,103,824 B2 | 9/2006 | Halford |
| 7,103,915 B2 | 9/2006 | Redlich et al. |
| 7,111,115 B2 | 9/2006 | Peters et al. |
| 7,140,044 B2 | 11/2006 | Redlich et al. |
| 7,146,644 B2 | 12/2006 | Redlich et al. |
| 7,171,493 B2 | 1/2007 | Shu et al. |
| 7,222,133 B1 | 5/2007 | Raipurkar et al. |
| 7,240,236 B2 | 7/2007 | Cutts et al. |
| 7,272,613 B2 | 9/2007 | Sim et al. |
| 7,636,724 B2 | 12/2009 | de la Torre et al. |
| 2002/0062422 A1 | 5/2002 | Butterworth et al. |
| 2002/0166079 A1 | 11/2002 | Ulrich et al. |
| 2003/0018927 A1 | 1/2003 | Gadir et al. |
| 2003/0037261 A1 | 2/2003 | Meffert et al. |
| 2003/0065617 A1 | 4/2003 | Watkins et al. |
| 2003/0084020 A1 | 5/2003 | Shu |
| 2004/0024963 A1 | 2/2004 | Talagala et al. |
| 2004/0122917 A1 | 6/2004 | Menon et al. |
| 2004/0215998 A1 | 10/2004 | Buxton et al. |
| 2004/0228493 A1 | 11/2004 | Ma |
| 2005/0100022 A1 | 5/2005 | Ramprashad |
| 2005/0114594 A1 | 5/2005 | Corbett et al. |
| 2005/0125593 A1 | 6/2005 | Karpoff et al. |
| 2005/0131993 A1 | 6/2005 | Fatula |
| 2005/0132070 A1 | 6/2005 | Redlich et al. |
| 2005/0144382 A1 | 6/2005 | Schmisseur |
| 2005/0229069 A1 | 10/2005 | Hassner et al. |
| 2006/0047907 A1 | 3/2006 | Shiga et al. |
| 2006/0136448 A1 | 6/2006 | Cialini et al. |
| 2006/0156059 A1 | 7/2006 | Kitamura |
| 2006/0224603 A1 | 10/2006 | Correll |
| 2007/0079081 A1 | 4/2007 | Gladwin et al. |
| 2007/0079082 A1 | 4/2007 | Gladwin et al. |
| 2007/0079083 A1 | 4/2007 | Gladwin et al. |
| 2007/0088970 A1 | 4/2007 | Buxton et al. |
| 2007/0174192 A1 | 7/2007 | Gladwin et al. |
| 2007/0214285 A1 | 9/2007 | Au et al. |
| 2007/0234110 A1 | 10/2007 | Soran et al. |
| 2007/0283167 A1 | 12/2007 | Venters et al. |
| 2009/0094251 A1 | 4/2009 | Gladwin et al. |
| 2009/0094318 A1 | 4/2009 | Gladwin et al. |
| 2010/0023524 A1 | 1/2010 | Gladwin et al. |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

(56) References Cited

OTHER PUBLICATIONS

Sermersheim; Lightweight Directory Access Protocol (LDAP): The Protocol; IETF Network Working Group; RFC 4511; Jun. 2006; pp. 1-68.
Satran, et al.; Internet Small Computer Systems Interface (iSCSI); IETF Network Working Group; RFC 3720; Apr. 2004; pp. 1-257.
Xin, et al.; Evaluation of Distributed Recovery in Large-Scale Storage Systems; 13th IEEE International Symposium on High Performance Distributed Computing; Jun. 2004; pp. 172-181.
Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

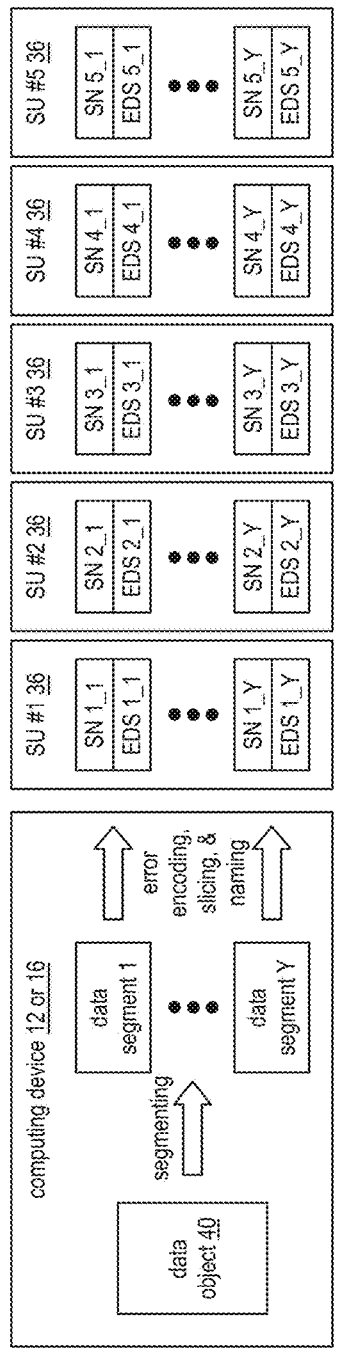
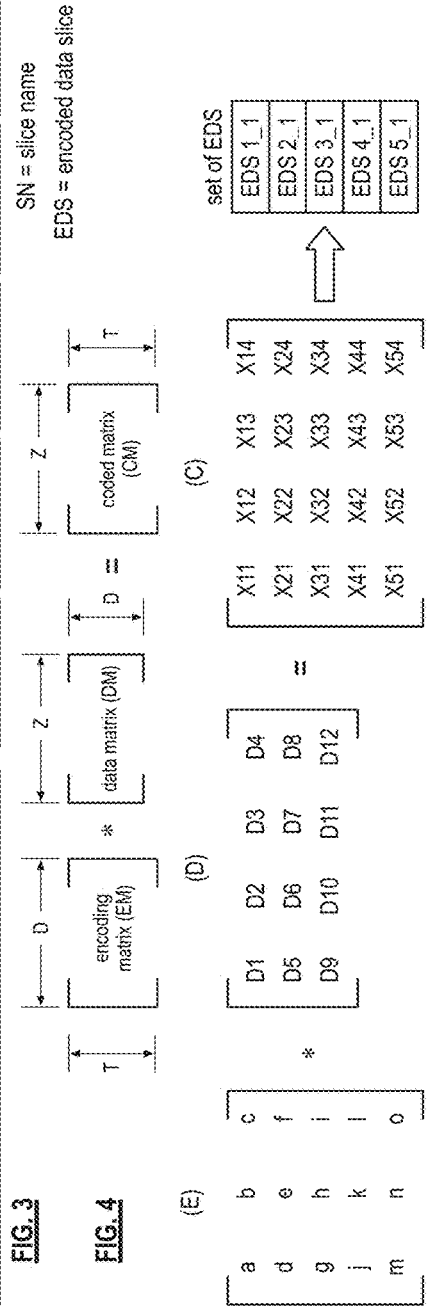

INITIATING REBUILD ACTIONS FROM DS PROCESSING UNIT ERRORS

CROSS REFERENCE TO RELATED PATENTS

The present U.S. Utility patent application claims priority pursuant to 35 U.S.C. § 119(e) to U.S. Provisional Application No. 62/260,743, entitled "COMMUNICATING DISPERSED STORAGE NETWORK STORAGE UNIT TASK EXECUTION STATUS", filed Nov. 30, 2015, which is hereby incorporated herein by reference in its entirety and made part of the present U.S. Utility patent application for all purposes.

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

For cloud storage systems, security is an on-going challenge. Breach prevention and breach detection are two primary issues for secure cloud storage operation. Breach prevention is directed towards preventing unauthorized access to the cloud storage system. Breach detection is directed towards detecting a potential unauthorized access, determining when it is unauthorized, and, if it is, taking corrective measures. Such corrective measures includes updating breach detection, removing hardware from the system, attempting to recover compromised data, etc.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

DETAILED DESCRIPTION OF THE INVENTION

Figure 1:
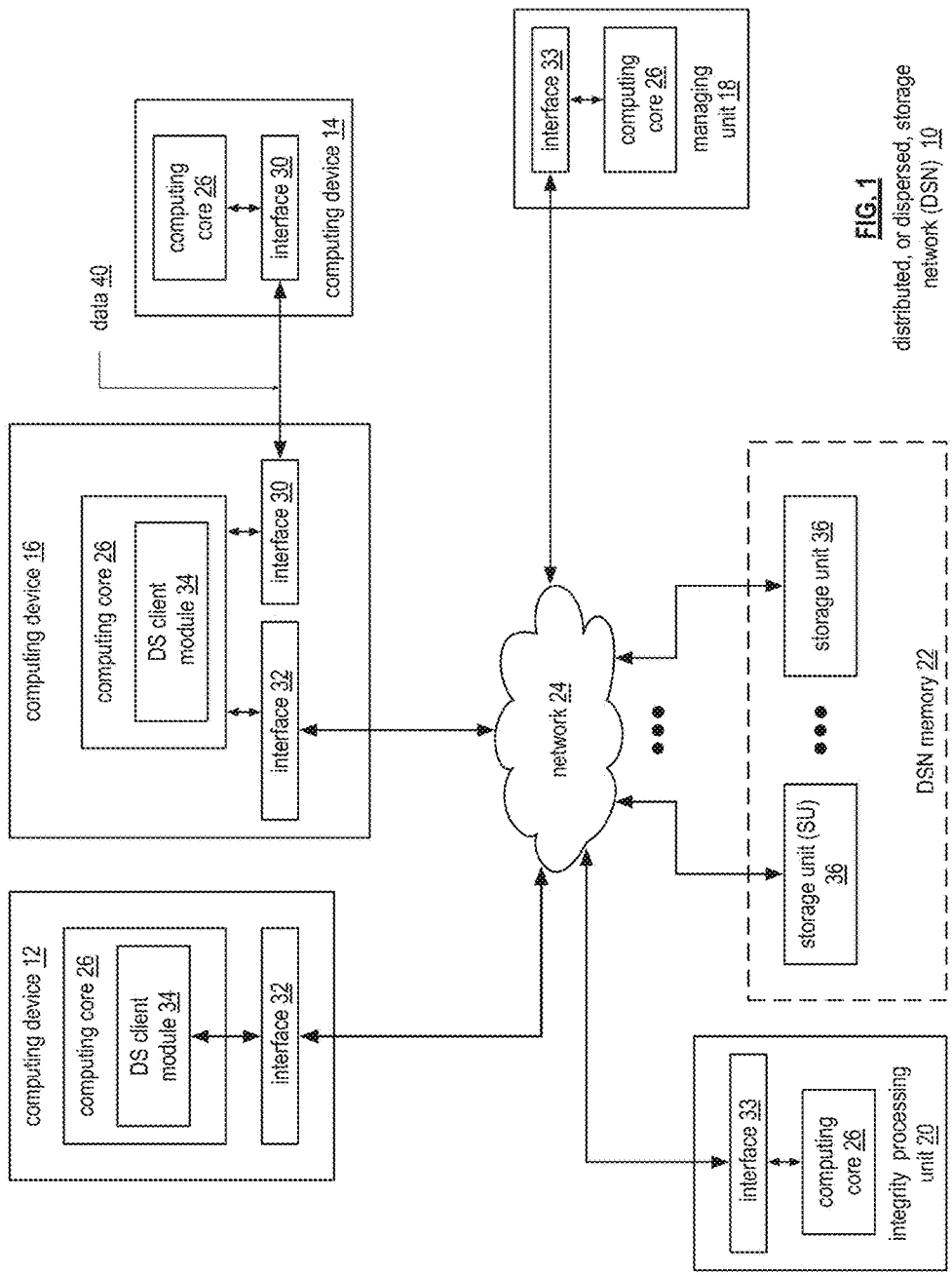
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
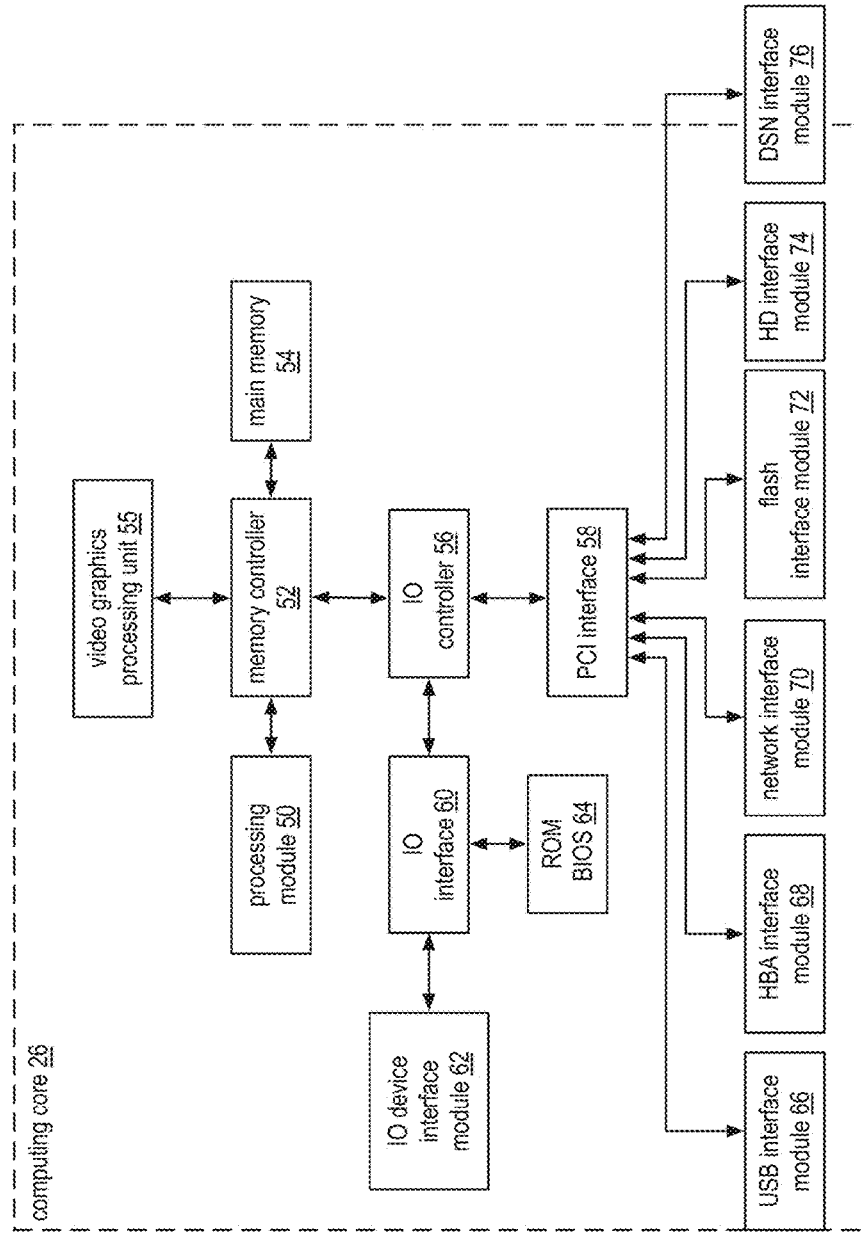
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate a per-access billing information. In another instance, the managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (I/O) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figures 7, 8:
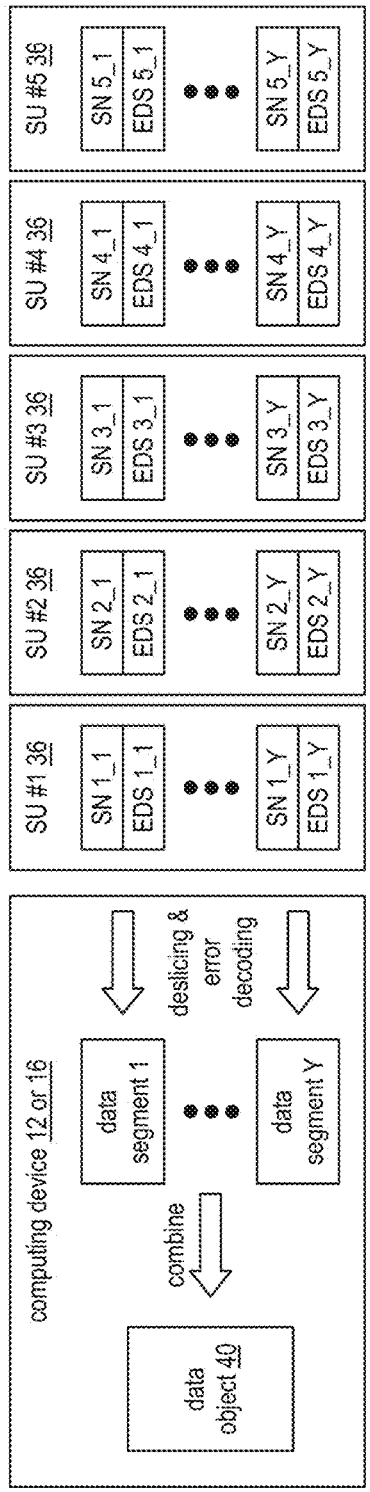
FIG. 7 is a schematic block diagram of an example of dispersed storage error decoding of data in accordance with the present invention.
FIG. 8 is a schematic block diagram of a generic example of an error decoding function in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
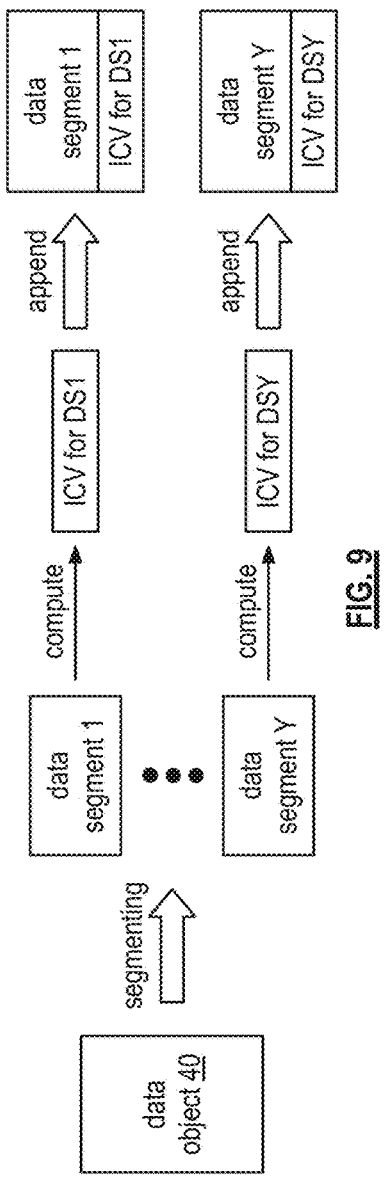
FIG. 9 is a schematic block diagram of another example of dispersed storage error encoding of data in accordance with the present invention.

FIG. 9 is a schematic block diagram of another example of dispersed storage error encoding of data. In accordance with the data segmenting protocol, the computing device 12 or 16 divides the data (e.g., a file (e.g., text, video, audio, etc.), a data object, or other data arrangement) into a plurality of data segments. The number (Y) of data segments created is dependent of the size of the data and the data segmenting protocol.

The computing device then computes an integrity check value for each data segment 1-Y. In one example, the integrity check value is generated by performing a hash function on the data segment. As another example, the ICV is generated using a cyclic redundancy check (CRC) function on the data segment. The integrity check values are then stored locally in the computing device or in one or more storage units that do not store an encoded data slice associated with the data segment that corresponds to a corresponding ICV. The computing device then appends each integrity check value to a corresponding data segment (e.g., DS1-DSY).

Figure 10:
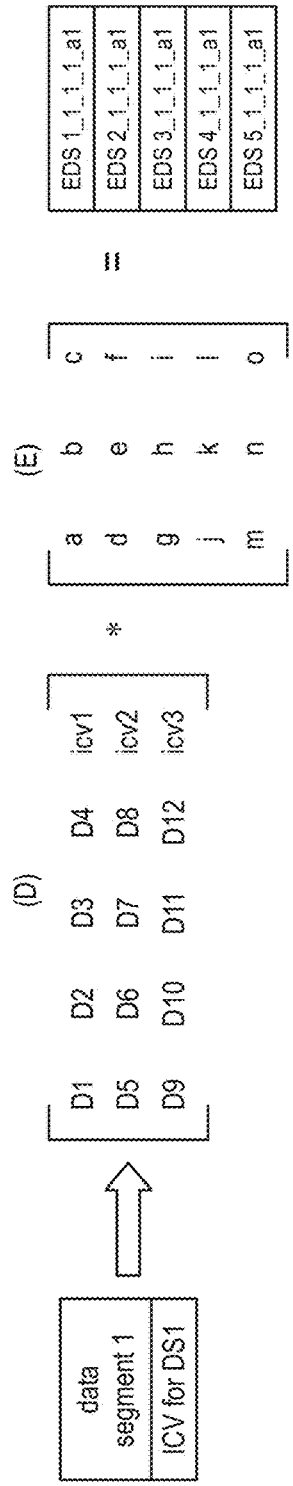
FIG. 10 is a schematic block diagram of another specific example of an error encoding function in accordance with the present invention.

FIG. 10 illustrates a specific example of Cauchy Reed-Solomon encoding with a pillar number (T) of five and decode threshold number of three. In this example, a first data segment is divided into twelve data blocks (D1-D12) and 3 ICV blocks (icv1-icv3).

The computing device 12 or 16 then disperse storage error encodes the data segment using the selected encoding function (e.g., Cauchy Reed-Solomon) to produce a set of encoded data slices (e.g., EDS 1_1_1_1_a1 through EDS 5_1_1_1_a1).

Figure 11:
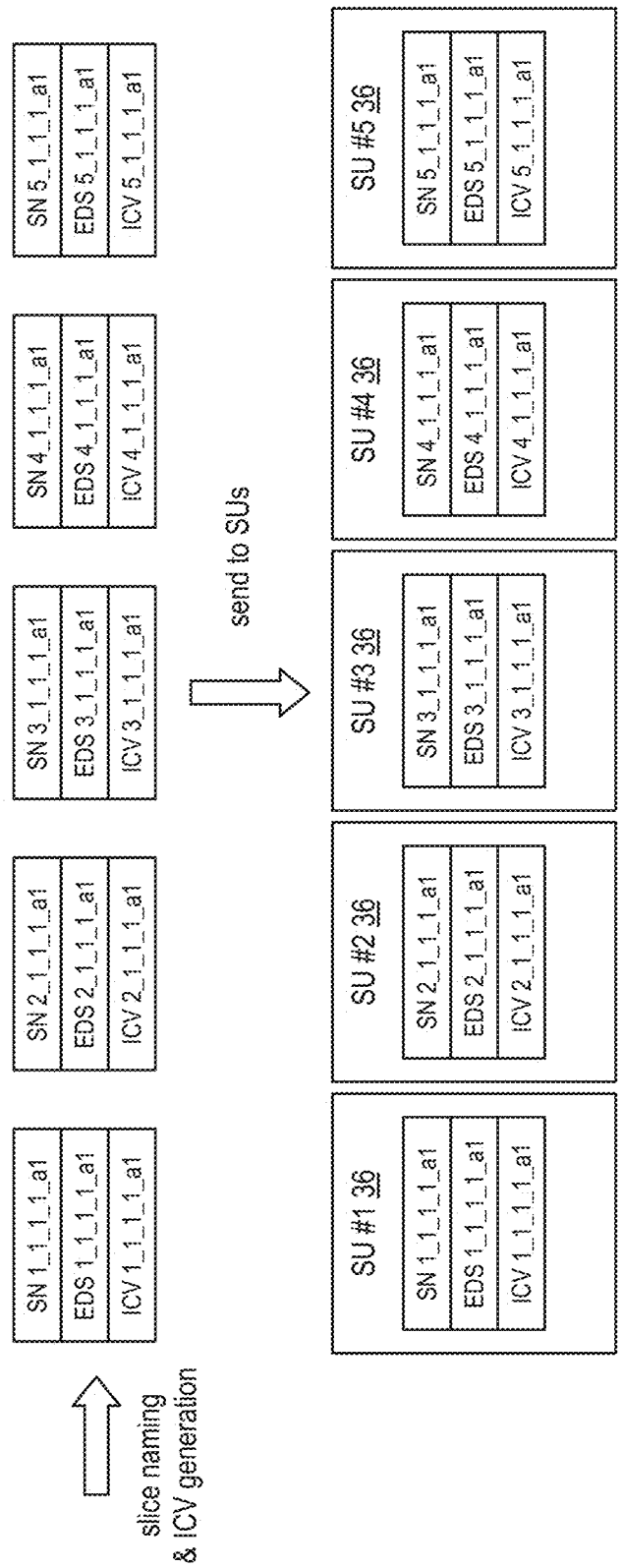
FIG. 11 is a schematic block diagram of an example of generating slice names and integrity check values for a set of encoded data slices in accordance with the present invention.

FIG. 11 is a schematic block diagram of an example of generating slice names and integrity check values for a set of encoded data slices. For each encoded data slice, a slice name and integrity check value is generated. In particular, five EDSs and SNs are created for this set: 1_1_1_1_a1; 2_1_1_1_a1; 3_1_1_1_a1; 4_1_1_1_a1; and 5_1_1_1_a1. The first digit of the EDS and SN represents the slice number in the set (e.g., 1-5); The second digit represents the segment number (e.g., 1-Y); the third digit represents the vault number (e.g., a logical storage container of the DSN having one or more user devices affiliated with it); The fourth digit represents the current revision number of the EDS; The fifth value (e.g., a1) represents a data object identifier.

Continuing with the example, for each encoded data slice (EDS) and/or slice name (SN) of the set, an integrity check value is created. As a specific example, an ICV is generated from the encoded data slice, the slice name, or both the encoded data slice and the slice name. For instance, ICV 1_1_1_1_a1 is created for EDS 1_1_1_1_a1 and/or SN 1_1_1_1_a1. The set of encoded data slices, along with corresponding slice names and integrity check values are sent to a set of storage units for storage.

Figure 12:
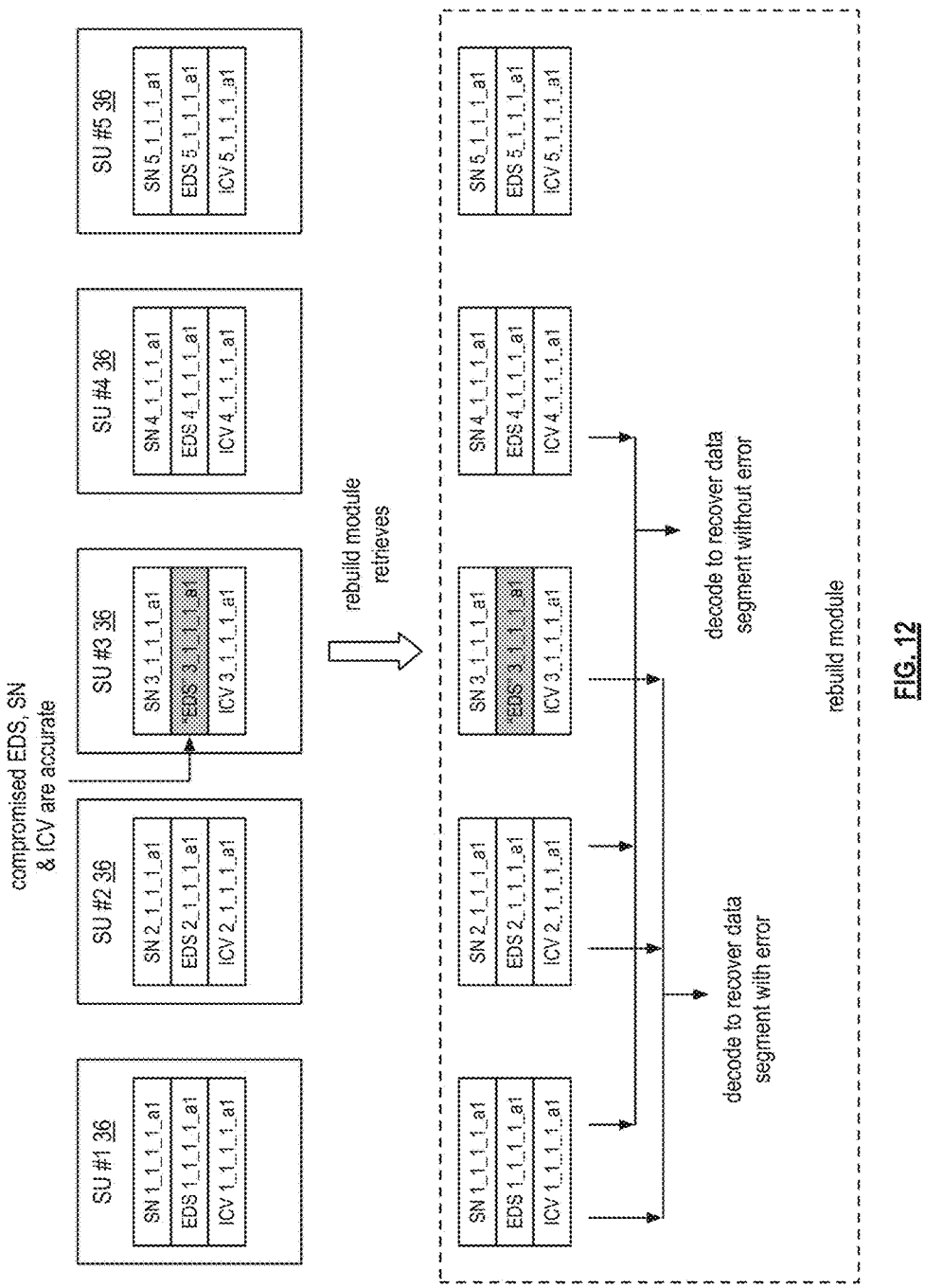
FIG. 12 is a schematic block diagram of an example of retrieving a set of encoded data slices in accordance with the present invention.

FIG. 12 is a schematic block diagram of an example of retrieving a set of encoded data slices. As shown, encoded data slices EDS 1_1_1_1_a1 through EDS 5_1_1_1_a1 are stored in storage units SU #1-5 with corresponding slices names (e.g., SN 1_1_1_1_a1-5_1_1_1_a1) and integrity check values (e.g., ICV 1_1_1_1_a1-5_1_1_1_a1). As is further shown, "EDS" 3_1_1_1_a1 is a seemingly valid encoded data slice as the slice name and ICV associated with EDS appear to be valid (e.g., a slice level ICV (e.g., ICV 3_1_1_1_a1) matches a stored value). However, during a decoding of the seemingly valid encoded data slices, a computing device detects a recovery error (e.g., the segment level ICV (e.g., ICV for DS1 of FIG. 10) does not match a stored segment level ICV) associated with the data segment. The computing device then sends a notice of the recovery error and a known ICV for the data segment to a rebuild module of the DSN.

The rebuilding module retrieves the set of encoded data slices (e.g., EDS 1_1_1_1_a1-EDS 5_1_1_1_a1) and selectively decodes different combinations of a decode threshold number of the encoded data slices until a data segment associated with the set of encoded data slices has been successfully recovered. As a specific example, a decode threshold is 3 and a pillar width is 5. The rebuild module selects EDS 1_1_1_1_a1, EDS 2_1_1_1_a1, and EDS 3_1_1_1_a1 as the first combination of the decode threshold number of encoded data slices. The rebuild module then decodes the first combination to recover a first data segment and compares the data segment integrity check value (e.g., ICV for DS1 of FIG. 10) with the known integrity check value. When the comparing is unfavorable (e.g., the data segment ICV is not substantially identical to a known ICV), the rebuild module selects a second combination of the decode threshold number of encoded data slices (e.g., EDS 1_1_1_1_a1, EDS 2_1_1_1_a1, and EDS 4_1_1_1_a1). The rebuild module then decodes the second combination to produce a second data segment and compares the data segment integrity check value with the known ICV. In this instance, the comparing is favorable, indicating the data segment has been recovered without an error.

Figure 13:
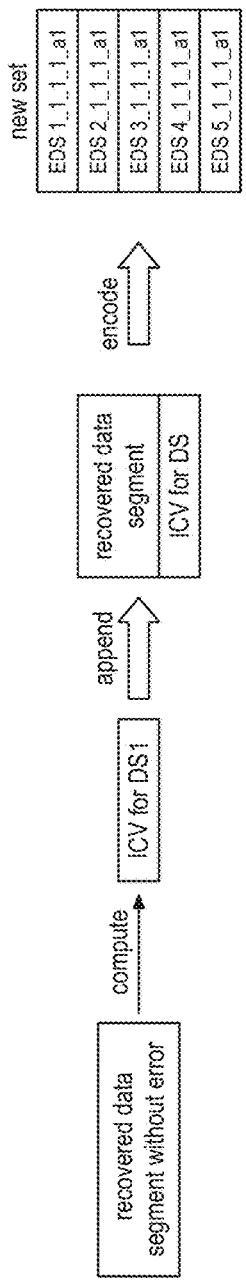
FIG. 13 is a schematic block diagram of an example of creating a new set of encoded data slices from a recovered data segment without error in accordance with the present invention.

FIG. 13 is a schematic block diagram of creating a new set of encoded data slices from a recovered data segment without error. As shown, the rebuilding device computes an integrity check value (ICV) for the recovered data segment without error. The ICV is then appended to the recovered data segment. Then, similar to FIG. 10, the computing device dispersed storage error encodes the recovered data segment to produce a new set of encoded data slices and a corresponding set of slice names (SN). In this example, the computing device further generates an integrity check value (ICV) for each encoded data slice (EDS). The ICV may be created in a variety of ways. For example, the ICV is generated using a hash function. As another example, the ICV is generated using a cyclic redundancy check (CRC) function.

Figure 14:
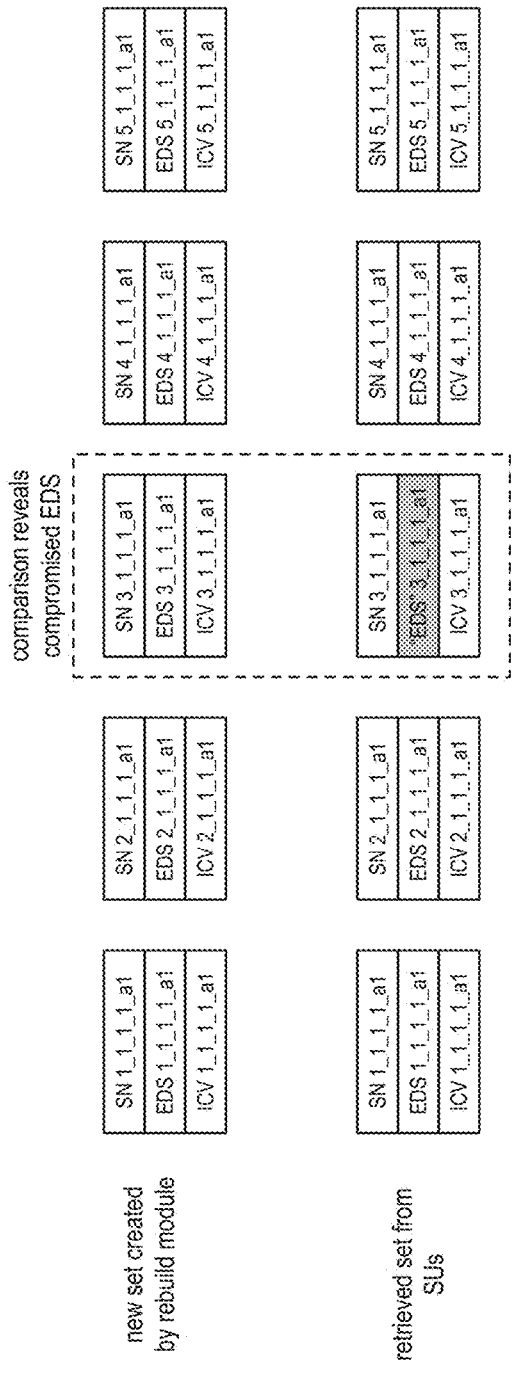
FIG. 14 is a schematic block diagram of an example of comparing a new set of encoded data slices and a retrieved set of encoded data slices in accordance with the present invention.

FIG. 14 is a schematic block diagram of an example of comparing a new set of encoded data slices and a retrieved set of encoded data slices (e.g., the seemingly valid threshold number of existing encoded data slices). The rebuild module having generated the new set of encoded data slices, compares the new set of encoded data slices to the retrieved set of encoded data slices to reveal which encoded data slices have been compromised. For example, the rebuild module identifies EDS 3_1_1_1_a1 as a corrupted encoded data slice after comparing EDS 3_1_1_1_a1 with "EDS" 3_1_1_1_a1 and determining that "EDS" 3_1_1_1_a1 is not substantially identical to EDS 3_1_1_1_a1. Having identified the corrupted encoded data slices, the rebuild module sends EDS 3_1_1_1_a1 from the new set of encoded data slices to a storage unit to replace the corrupted "EDS" 3_1_1_1_a1. Alternatively, the rebuild module sends EDS 3_1_1_1_a1 to one or more other storage units for storage (e.g., when the compromised EDS indicates a security issue, when the compromised indicates a reliability issue, etc.).

Figure 15:
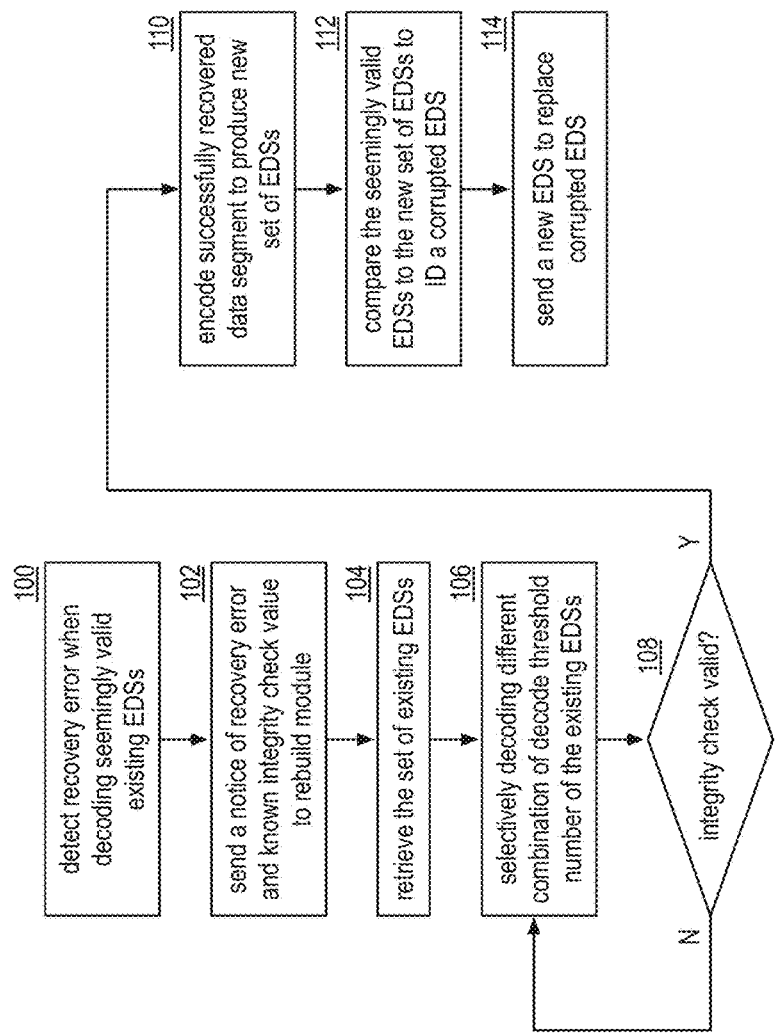
FIG. 15 is a logic diagram of an example of a method of detecting a recovery error in accordance with the present invention.

FIG. 15 is a logic diagram of an example of a method of detecting a recovery error. The method begins with step 100, where a computing device of a dispersed storage network (DSN) detects a recovery error when decoding a seemingly valid threshold number of existing encoded data slices of a set of existing encoded data slices. For example, the computing device detects the recovery error by comparing an integrity check value of a successfully recovered data segment with a locally stored integrity check value of the data segment and when the comparing yields an unfavorable result, the computing device indicates the recovery error. Note the data segment of a data object was dispersed storage error encoded to produce the set of existing encoded data slices.

The method continues with step 102, where the computing device sends a notice of the recovery error and a known integrity check value for the data segment to a rebuild module of the DSN. The method continues with step 104, where the rebuilding module retrieves the set of existing encoded data slices. Note the computing device may also send pillar numbers of the seemingly valid threshold number of existing encoded data slices to the rebuilding module. The method continues with step 106, where the rebuilding module selectively decodes a different combination of a decode threshold number of existing encoded data slices of the set of existing encoded data slices until the data segment is successfully recovered.

The method continues with step 108, where the rebuilding module determines if the integrity check value of the successfully recovered data segment is valid. For example, for a first combination of the set of existing encoded data slices the rebuilding module recovers a first data segment, generates an integrity check value for the first data segment, compares the integrity check value for the first data segment with the known integrity check value, and when the comparing is favorable, indicates the first combination produces the successfully recovered data segment.

When the comparing the integrity check value is unfavorable, the method loops back to step 106. For example, when the comparing is unfavorable, the rebuild module selects a second combination of the set of existing encoded data slices to produce a second recovered data segment, generates a second integrity check value for the second recovered data segment, and compares the second integrity check value with the known integrity check value. When the comparing is favorable, the rebuild module indicates the second combination produces the successfully recovered data segment. Note if all combinations of a decode threshold number of existing encoded data slices do not produce a favorable comparing, the rebuild module may end the method and send an error message to the computing device.

When the comparing the integrity check value is favorable, the method continues with step 110, where the rebuild module dispersed storage error encodes the successfully recovered data segment to produce a set of new encoded data slices. The method continues with step 112, where the rebuild module compares the seemingly valid threshold number of existing encoded data slices with corresponding new encoded data slices of the set of new encoded data slices on an encoded data slice by encoded data slice basis to identify a corrupted encoded data slice of the seemingly valid threshold number of existing encoded data slices.

For example, for a first existing encoded data slice of the seemingly valid threshold number of existing encoded data slices, the rebuild module compares a first existing slice name of the first existing encoded data slice with a first new slice name of a first new encoded data slice of the set of new encoded data slices, compares a first existing integrity check value of the first existing encoded data slice with a first new integrity check value of the first new encoded data slice and compares a first existing encoded portion of the first existing encoded data slice with a first new encoded portion of the first new encoded data slice. When one or more of the comparisons is unfavorable, the rebuild module identifies the first existing encoded data slice as the corrupted encoded data slice. The method continues with step 114, where the rebuild module sends a new EDS to a storage unit to replace the corrupted encoded data slice. Alternatively, the rebuild module also sends one or more of the first new slice name and the first new integrity check value.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions.

The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method comprises:
   detecting, by a computing device of a dispersed storage network (DSN), a recovery error when decoding a seemingly valid threshold number of existing encoded data slices of a set of existing encoded data slices, wherein a data segment of a data object was dispersed storage error encoded to produce the set of existing encoded data slices;

sending, by the computing device, a notice of the recovery error and a known integrity check value for the data segment to a rebuild module of the DSN;

retrieving, by the rebuild module, the set of existing encoded data slices;

selectively decoding, by the rebuild module, a different combination of a decode threshold number of existing encoded data slices of the set of existing encoded data slices until the data segment is successfully recovered;

dispersed storage error encoding, by the rebuild module, the successfully recovered data segment to produce a set of new encoded data slices; and comparing, by the rebuild module, the seemingly valid threshold number of existing encoded data slices with corresponding new encoded data slices of the set of new encoded data slices on an encoded data slice by encoded data slice basis to identify a corrupted encoded data slice of the seemingly valid threshold number of existing encoded data slices.

2. The method of claim 1, wherein the sending further comprises:

sending pillar numbers of the seemingly valid threshold number of existing encoded data slices.

3. The method of claim 1, wherein the detecting the recovery error comprises:

comparing an integrity check value of the successfully recovered data segment with a locally stored integrity check value of the data segment; and when the comparing yields an unfavorable result, indicating the recovery error.

4. The method of claim 1, wherein the selectively decoding further comprises:

for a first combination of the set of existing encoded data slices, recovering a first data segment;

generating an integrity check value for the first data segment;

comparing the integrity check value for the first data segment with the known integrity check value; and when the comparing is favorable, indicating the first combination produces the successfully recovered data segment.

5. The method of claim 4 further comprises:

when the comparing is unfavorable, selecting a second combination of the set of existing encoded data slices to produce a second recovered data segment;

generating a second integrity check value for the second recovered data segment;

comparing the second integrity check value with the known integrity check value; and when the comparing is favorable, indicating the second combination produces the successfully recovered data segment.

6. The method of claim 1, wherein the comparing comprises:

for a first existing encoded data slice of the seemingly valid threshold number of existing encoded data slices:

comparing a first existing slice name of the first existing encoded data slice with a first new slice name of a first new encoded data slice of the set of new encoded data slices;

comparing a first existing integrity check value of the first existing encoded data slice with a first new integrity check value of the first new encoded data slice;

comparing a first existing encoded portion of the first existing encoded data slice with a first new encoded portion of the first new encoded data slice; and when one or more of the comparisons is unfavorable, identifying the first existing encoded data slice as the corrupted encoded data slice.

7. The method of claim 1 further comprises:

sending a new encoded data slice (EDS) to a storage unit to replace the corrupted encoded data slice.

8. A rebuild module comprises:

an interface;

memory; and a processing module operably coupled to the interface and the memory, wherein the processing module is operable to:

receive, via the interface and from a computing device of a dispersed storage network (DSN), a recovery error regarding a seemingly valid threshold number of existing encoded data slices of a set of existing encoded data slices and a known integrity check of a data segment, wherein the data segment of a data object was dispersed storage error encoded to produce the set of existing encoded data slices;

retrieve, via the interface the set of existing encoded data slices from storage units of the DSN;

selectively decode a different combination of a decode threshold number of existing encoded data slices of the set of existing encoded data slices until the data segment is successfully recovered;

dispersed storage error encode the successfully recovered data segment to produce a set of new encoded data slices; and compare the seemingly valid threshold number of existing encoded data slices with corresponding new encoded data slices of the set of new encoded data slices on an encoded data slice by encoded data slice to identified a corrupted encoded data slice of the seemingly valid threshold number of existing encoded data slices.

9. The rebuild module of claim 8, wherein the processing module is further operable to:

receive, via the interface, pillar numbers of the seemingly valid threshold number of existing encoded data slices.

10. The rebuild module of claim 8, wherein the processing module is further operable to detect the recovery error by:

comparing an integrity check value of the successfully recovered data segment with a locally stored integrity check value of the data segment; and when the comparing yields an unfavorable result, indicate the recovery error.

11. The rebuild module of claim 8, wherein the processing module is further operable to perform the selectively decoding by:

for a first combination of the set of existing encoded data slices, recovering a first data segment;

generating an integrity check value for the first data segment;

comparing the integrity check value for the first data segment with the known integrity check value; and when the comparing is favorable, indicating the first combination produces the successfully recovered data segment.

12. The rebuild module of claim 11, wherein the processing module is further operable to:

when the comparing is unfavorable, select a second combination of the set of existing encoded data slices to produce a second recovered data segment;

generate a second integrity check value for the second recovered data segment;

compare the second integrity check value with the known integrity check value; and when the comparing is favorable, indicate the second combination produces the successfully recovered data segment.

13. The rebuild module of claim 8, wherein the processing module is further operable to:
for a first existing encoded data slice of the seemingly valid threshold number of existing encoded data slices:
compare a first existing slice name of the first existing encoded data slice with a first new slice name of a first new encoded data slice of the set of new encoded data slices;
compare a first existing integrity check value of the first existing encoded data slice with a first new integrity check value of the first new encoded data slice;
compare a first existing encoded portion of the first existing encoded data slice with a first new encoded portion of the first new encoded data slice; and
when one or more of the comparisons is unfavorable, identify the first existing encoded data slice as the corrupted encoded data slice.

14. The rebuild module of claim 8, wherein the processing module is further operable to:
send, via the interface, a new encoded data slice (EDS) to a storage unit to replace the corrupted encoded data slice.

* * * * *